United States Patent
Liao

(10) Patent No.: US 7,866,990 B2
(45) Date of Patent: Jan. 11, 2011

(54) SOCKET ASSEMBLY WITH PICK-UP CAP SERVING AS STAND-OFF

(75) Inventor: Fang-Jwu Liao, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/549,405

(22) Filed: Aug. 28, 2009

(65) Prior Publication Data

US 2010/0267254 A1    Oct. 21, 2010

(30) Foreign Application Priority Data

Apr. 20, 2009   (TW) .............................. 98206552 U

(51) Int. Cl.
*H01R 13/44*   (2006.01)
(52) U.S. Cl. ...................................... 439/135; 439/940
(58) Field of Classification Search .................. 439/135, 439/940
See application file for complete search history.

(56) References Cited

U.S. PATENT DOCUMENTS

| 7,140,890 | B1 | 11/2006 | Ju | |
| 7,153,147 | B2 * | 12/2006 | Li et al. | 439/135 |
| 7,530,822 | B2 * | 5/2009 | Liao | 439/135 |
| 7,578,684 | B2 * | 8/2009 | Liao | 439/135 |
| 2007/0184690 | A1 * | 8/2007 | Ma | 439/135 |

* cited by examiner

*Primary Examiner*—Gary F. Paumen
(74) *Attorney, Agent, or Firm*—Andrew C. Cheng; Wei Te Chung; Ming Chieh Chang

(57) ABSTRACT

An socket assembly mounted on a printed circuit board for receiving a IC package, comprises an insulative housing defining a plurality of passageways, a plurality of contacts received in the passageways and a pick-up cap covering the insulative housing. The insulative housing has four sidewalls surrounding the passageways. The pick-up cap has three steps, a first step covering the passageways of the housing, a second step seated on top faces of the sidewalls, and a third step set against the printed circuit board. The three steps of the pick-up cap can efficiently protect the insulative housing and the contacts.

18 Claims, 12 Drawing Sheets

SOCKET ASSEMBLY WITH PICK-UP CAP SERVING AS STAND-OFF

BACKGROUND OF THE INVENTION

1. Field of the Invention

The present invention relates to a socket connector, and more particularly to a socket connector having a pick-up cap having a foot reachable to a printed circuit board serving as stand-off.

2. Description of the Related Art

U.S. Pat. No. 7,140,890 issued to Keelung on Mar. 17, 2006 discloses a conventional socket assembly mounted to a printed circuit board for electrically contacting with an IC package, the conventional socket assembly comprises an insulative housing having a plurality of passageways, a plurality of contacts received in the passageways, and a pick-up cap attached thereto and covering the insulative housing. The insulative housing is formed with the passageways in the middle thereof, a plurality sidewalls disposed on a peripheral of the insulative housing, a plurality of recesses recessed from four corners of the sidewalls. The contact has a base portion, a contacting portion extending upwardly from the base portion and contacting with the IC package and a solder portion extending downwardly and soldered to the printed circuit board), the contacting portion of the contact located beyond top faces of the sidewalls of the insulative housing. A pick-up cap mounted upon the insulative housing, comprises a planar top face for being absorbed by a vacuum tube, and a plurality of extending portions extending downwardly from four corners of the top face and having hooks which engage with the recesses of the insulative housing. The top face of the sidewalls of the insulative housing support a peripheral of the pick-up cap. Since the contacting portions of the contacts are higher than the top faces of the sidewalls of the insulative housing, when the pick-up cap is put on the insulative housing, the pick-up cap may destroy the contacting portions of the contacts. Though, the pick-up cap is mounted upon the peripheral of the insulative housing, but the extending portion is a short and a weak configuration, the socket assembly may be crushed or pressed during its transportation and that may break the extending portion, then the pick-up cap slides into the insulative housing and may destroy the insulative housing and the contacts.

Hence, it is required to improve the disadvantages of the above socket assembly.

SUMMARY OF THE INVENTION

An object of the invention is to provide a socket assembly with a pick-up cap, and the pick-up cap can be efficiently protect the insulative housing and the contacts.

To achieve the above-mentioned object, a socket assembly adapted for electrically connecting an IC package to a printed circuit board comprises an insulative housing having a plurality of passageways, a plurality of sidewalls extending upwardly from a peripheral of the insulative housing; and a pick-up cap attached on the insulative housing, a bottom face of the pick-up cap having three steps, comprising at least a first step covering the passageways of the insulative housing, a second step seated on top surfaces of the sidewalls of the insulative housing and a third step extending downwardly beyond a bottom face of the insulative housing.

Other features and advantages of the present invention will become more apparent to those skilled in the art upon examination of the following drawings and detailed description of preferred embodiments, in which:

DETAILED DESCRIPTION OF PREFERRED EMBODIMENT

Reference will now be made in detail to the preferred embodiments of the present invention.

Figure 1:
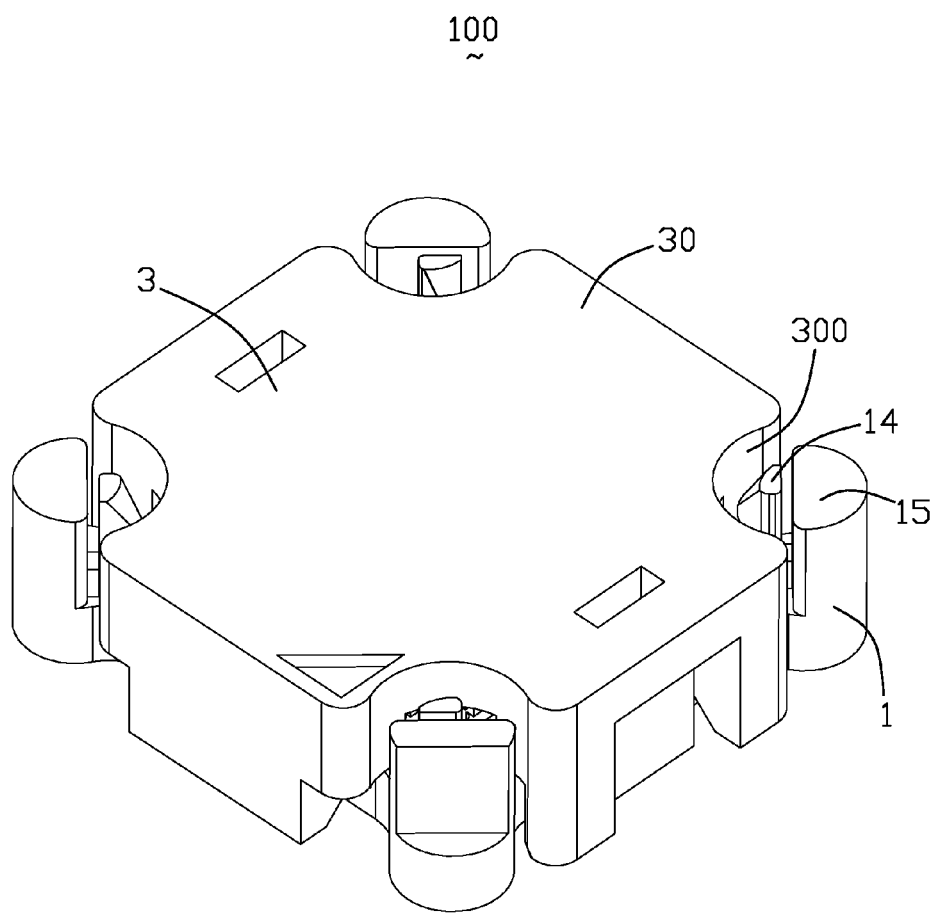
FIG. 1 is an assembled, perspective view of a socket assembly in accordance with a preferred embodiment of present invention.
Figure 2:
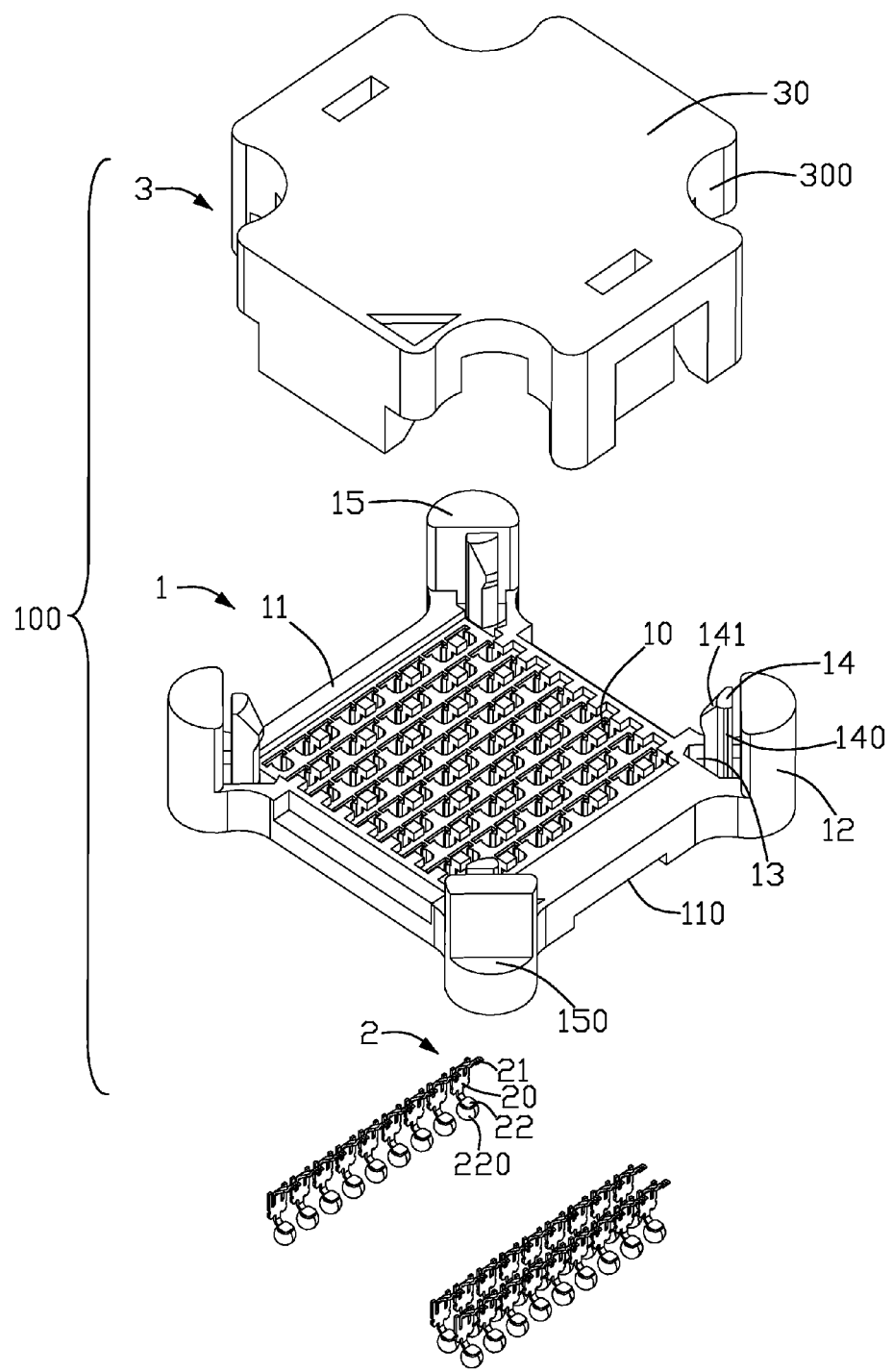
FIG. 2 is an exploded, perspective view of the socket assembly.
Figure 3:
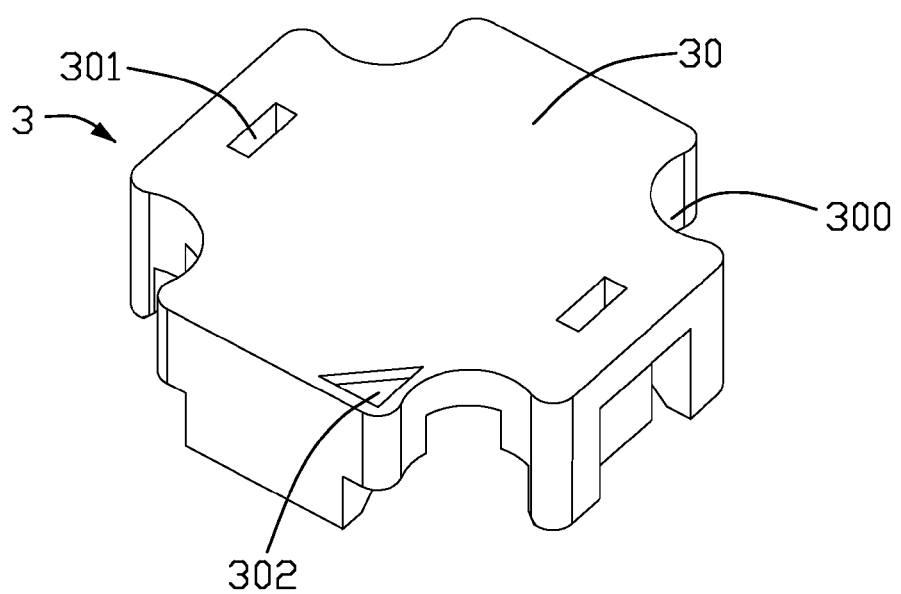
FIG. 3 is a perspective view of a pick-up cap of the socket assembly.
Figure 4:
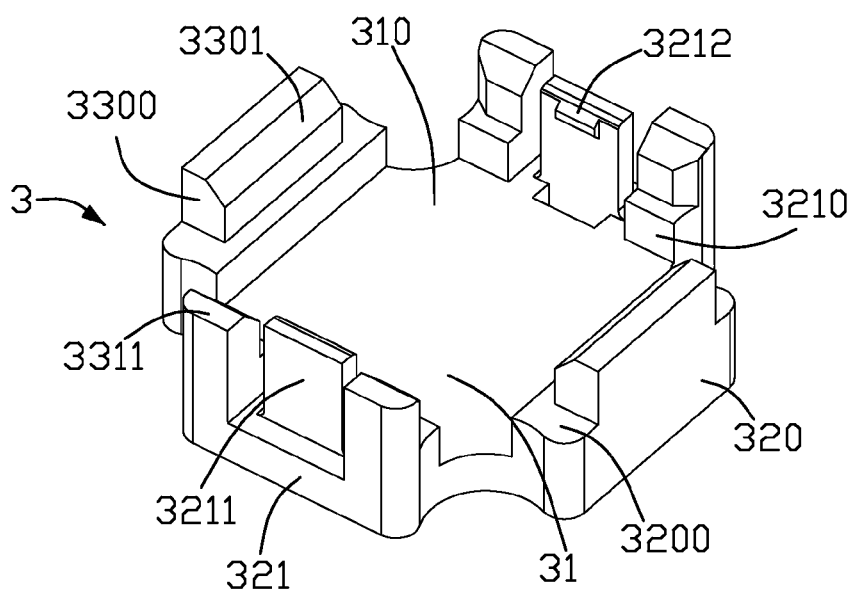
FIG. 4 is another perspective view of the pick-up cap of the socket assembly, showing a bottom side of the pick-up cap.
Figure 5:
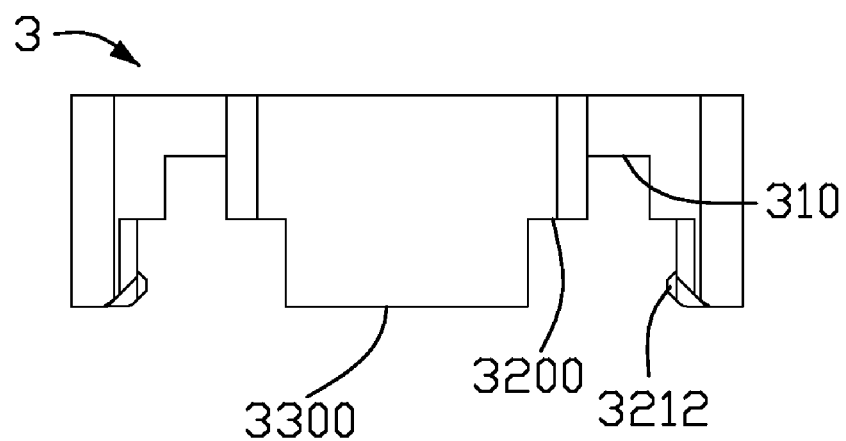
FIG. 5 is a side view of the pick-up cap of the socket assembly.
Figure 6:
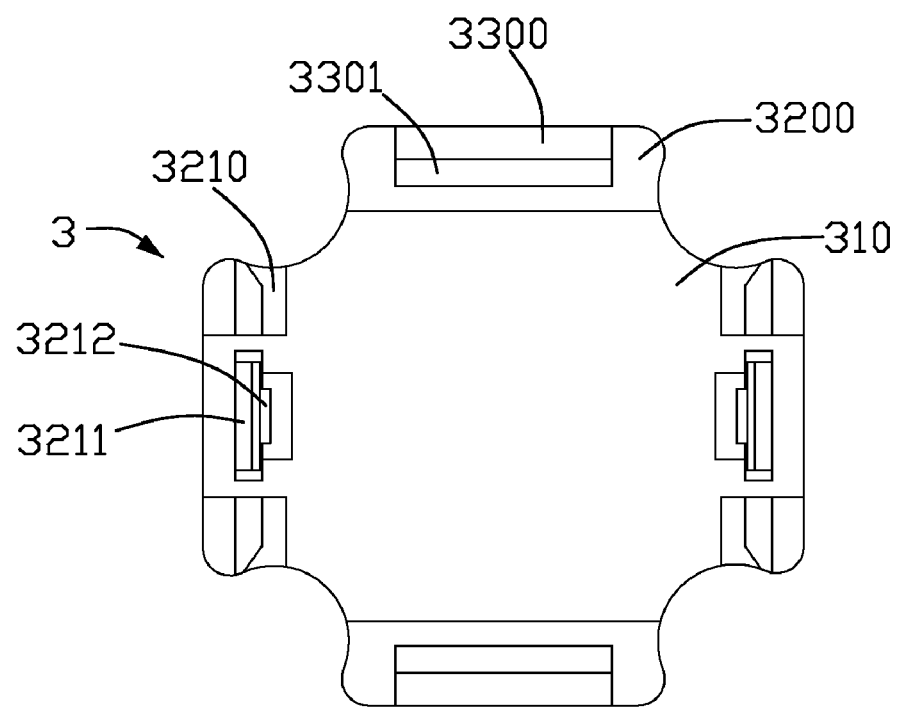
FIG. 6 is a bottom view of the pick-up cap of the socket assembly.
Figure 7:
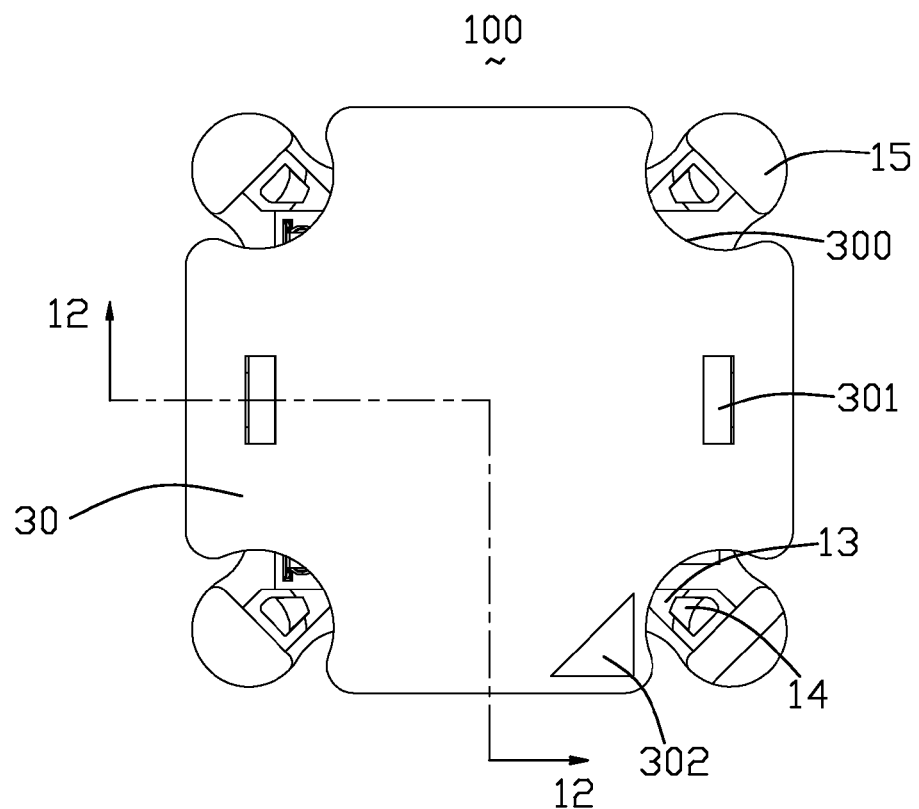
FIG. 7 is a top view of the socket assembly.
Figure 8:
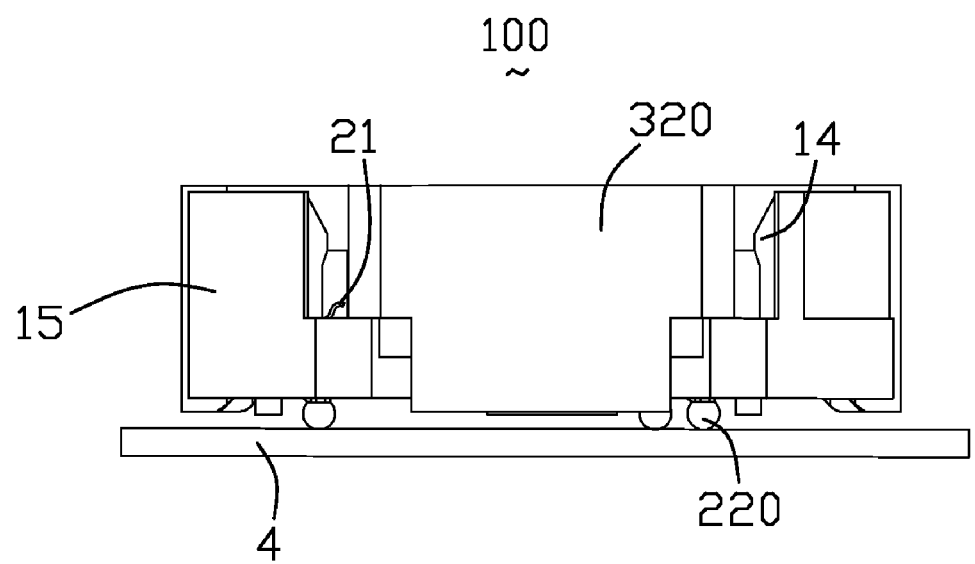
FIG. 8 is a side view of the socket assembly.
Figure 9:
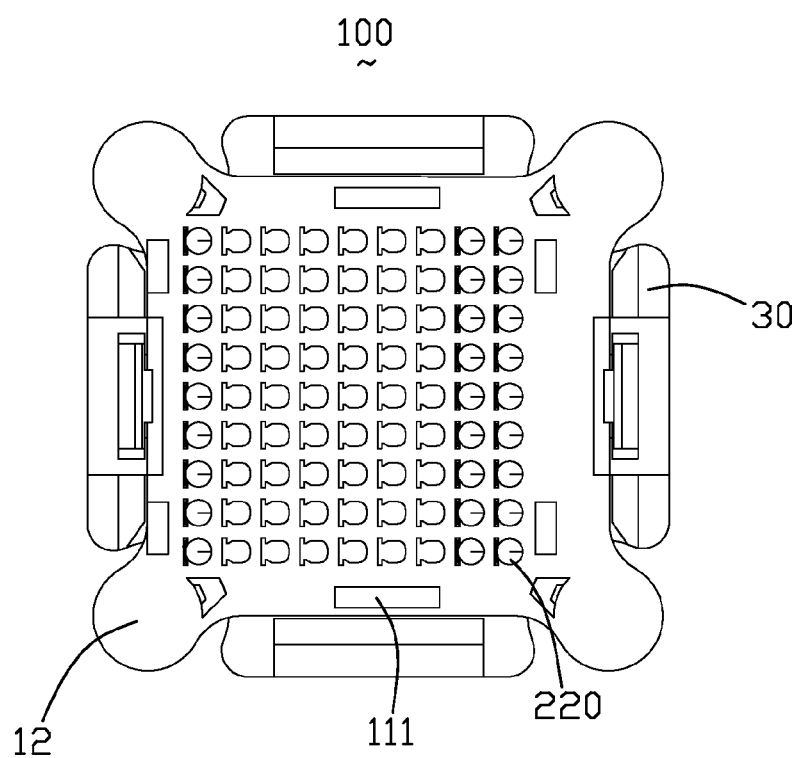
FIG. 9 is a bottom view of the socket assembly.
Figure 10:
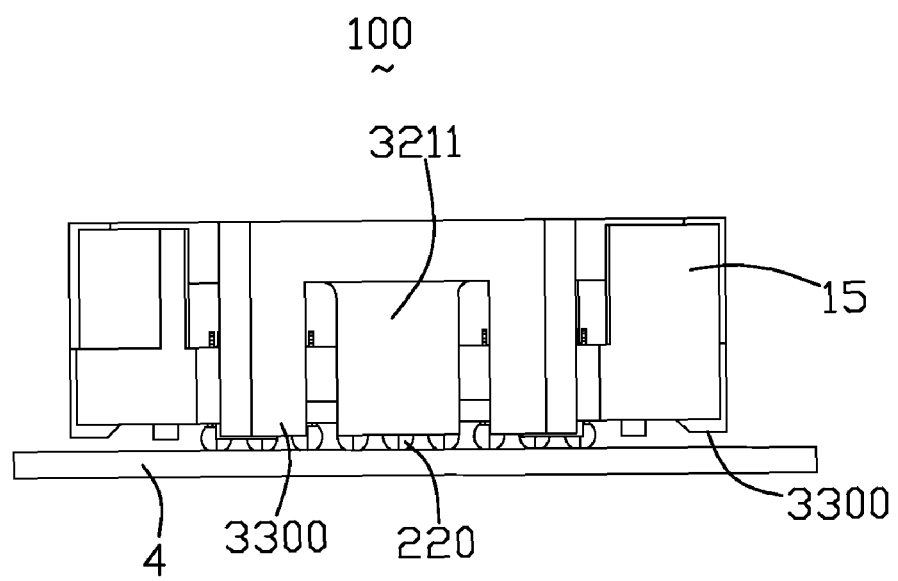
FIG. 10 is a front view of the socket assembly.
Figure 11:
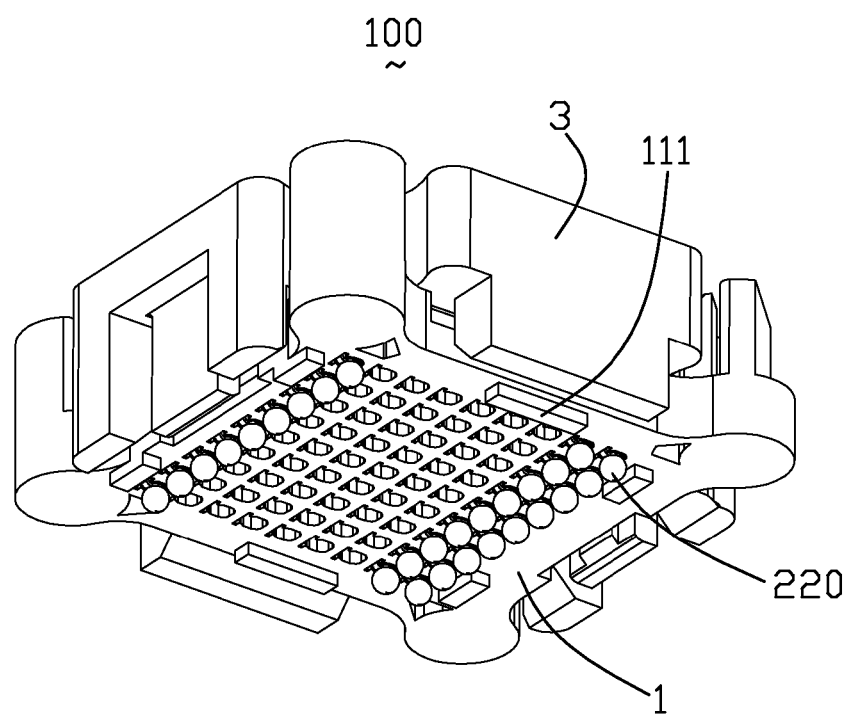
FIG. 11 is another assembled, perspective view of the socket assembly.
Figure 12:
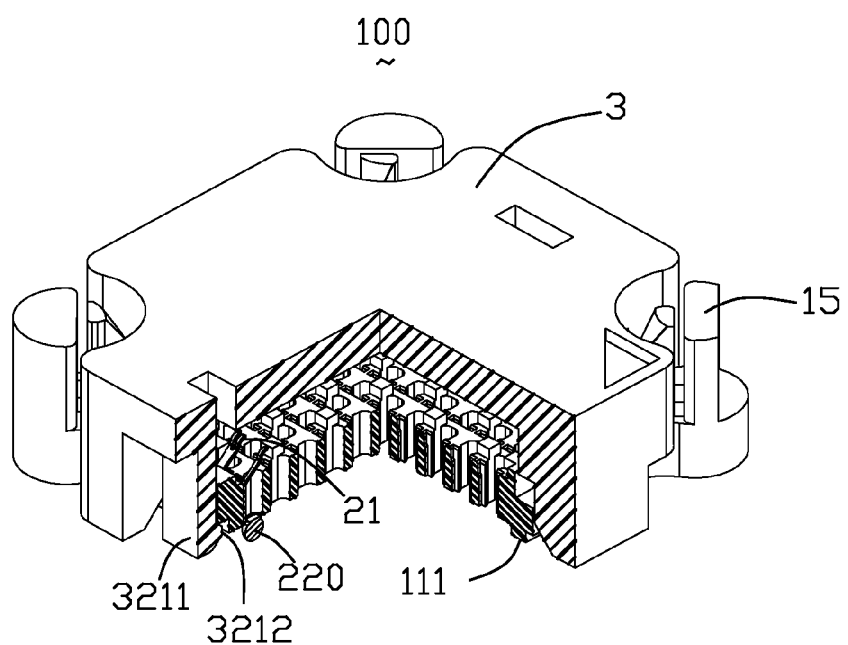
FIG. 12 is a section view of the socket assembly along 12-12 in FIG. 7.

Referring to FIGS. 1-2, a socket assembly 100 in accordance with the present invention, adapted for electrically connecting an IC package (not shown) to a printed circuit board 4, comprises an insulative housing 1 on the printed circuit board 4, a plurality of contacts 2 received in the insulative housing 1 and a pick-up cap 3 attached on the insulative housing 1.

The insulative housing 1 is mounted on the printed circuit board 4. The insulative housing 1 has a rectangular shaped configuration and includes a plurality of passageways 10 for receiving the contacts 2 therein, a plurality of sidewalls 11 extending upwardly from a circumference thereof. Every pair of opposite sidewalls define a recesses 110 recessed from a middle of a bottom surface of insulative housing 1. A plurality of protrusions 111 are formed on edges of the bottom surface of the insulative housing 1. A protruding portion 12 is formed on each of four corners of the sidewalls and extends upwardly and outwardly, and the protruding portion 12 defines a slot 13 near sidewall 11, and a locking portion 14 extending upwardly from a bottom wall of the slot 13 for positioning the IC package (not shown) in the insulative housing 1. The locking portion 14 includes a locking arm 140 and a hook 141 disposed on an end of the lock arm 140 and protruding toward a center of the insulative housing 1. Each protruding portion 12 has a half circular post 15 on an opposite side thereof relative to the slot 13, one of the post 15 has cutout 150 as an indication for operator.

A plurality of contacts 1 are accommodated in corresponding passageways 10 of the insulative housing 1, the contact 1 is stamped from a metal piece and comprises a base portion 20, a contacting portion 21 extending upwardly from the base portion 20, a solder portion 22 extending downwardly for connecting with a solder ball 220.

Referring to FIGS. 3-6, showing the pick-up cap 3 from different views, the pick-up cap 3 comprises a smoothly top face 30 and four circular gaps 300 on four corners of the pick-up cap 3 and being an arch shape. The pike-up cap has two holes 301 on the top face 30 thereof, a indicator 302 with a triangle configure near one of the gaps 300 and corresponding to the cutout 150 of the post 15 of the insulative housing 1. The pick-up cap 3 comprises a bottom face 31 with multi-steps, which comprises a rectangular first step 310 in a center thereof, two first posts 320 each extending downwardly from one of two opposite edges of the first step 310 and four second post 321 divided into two groups and extending downwardly from the other two opposite edges of the first step 310. A locking portion 3211 with a clasp 3212 on a bottom end thereof is formed between two second posts 321 in same group. Each of the first posts 320 and second posts 321 has a platform in a middle part thereof, the platforms are coplanar and defines a step face 3200 cooperatively. The second step 3210 is defined between the first step 310 and the step face 3200 of the pick-up cap 3, and the second step 3210 is located on a peripheral of the bottom face 31 and at a horizontal plane. Parts of the first posts 320 and the second posts 321 located below the step face 3200 are referred as the third step 3300. A plurality of leading faces 3301 extend upwardly from inner sides of a bottom face 3311 of the third step 3300 of the pick-up cap 3, and outside surfaces of the third step 3300 and the second step 3210 are located in a same upright face. The bottom face 3311 of the third step 3300 and the lock portion 3211 are located in a same horizontal surface.

Reference to FIGS. 7-12, when the pick-up cap 3 is attached to the insulative housing 1, the first step 310 of the pick-up cap 3 covers the passageways 10 of the insulative housing 1 and has a distance with the contacting portions 21 of the contacts 2 to protect the contacting portions 21. The second step 3210 of the pick-up cap 3 is mounted on the circumference of the insulative housing 1, with the step face 3200 seated on the top face of the sidewalls 11 of the insulative housing 1, to efficiently prevent pick-up cap 3 from moving downwardly or slipping away from the top face of the sidewalls 11. The clasp 3212 of the locking portion 3211 engage with the recesses 110 of the insulative housing 1 to retain the pick-up cap 3 to the insulative housing 1. The bottom face 3311 of the third step 3300 and the protrusion 111 of the insulative housing 1 together abut against the printed circuit board 4. When the solder balls 220 attached on the solder portions 22 of the contacts 2 are soldered to the printed circuit board 4, the third step 3300 of the pick-up cap 3 and the protrusion 111 of the insulative housing 1 can support the socket assembly and can efficiently protect the solder ball 220 from short circuit.

The pick-up cap 3 has three steps, comprising the first step 310 located over the passageways 11 of the insulative housing 1, the second step 3210 seated on top faces of the sidewalls 11 of the insulative housing 1 and the third step 3300 seated on the print circuit board (not shown), these steps 310, 3210, 3300 can efficiently protect the contacts 2 and the insulative housing 1.

Furthermore, although the present invention has been described with reference to particular embodiments, it is not to be construed as being limited thereto. Various alterations and modifications can be made to the embodiments without in any way departing form the scope or spirit of the present invention as defined in the appended claims.

What is claimed is:

1. A socket assembly adapted for electrically connecting an IC package to a printed circuit board comprising:
    an insulative housing having a plurality of passageways, a plurality of sidewalls extending upwardly from a peripheral of the insulative housing; and
    a pick-up cap attached on the insulative housing, a bottom face of the pick-up cap having three steps, comprising at least a first step covering the passageways of the insulative housing, a second step seated on top surfaces of the sidewalls of the insulative housing and a third step extending downwardly beyond a bottom face of the insulative housing.

2. The socket assembly as described in claim 1, wherein the first step is in a rectangular configuration and located in a center of the bottom face of the pick-up cap, the first step and has a distance with a plurality of contacts disposed in the passageways.

3. The socket assembly as described in claim 2, wherein the pick-up cap has two first posts extending downwardly from two opposite edges of the first step and four second posts extending downwardly from the other two opposite edges of the first step, each of the first posts and second posts has a platform in a middle part thereof, and the platforms are coplanar and define a step face cooperatively.

4. The socket assembly as described in claim 1, wherein the second step is defined between the first step and the step face of the pick-up cap, and the second step is located on a peripheral of the bottom face of the pick-up cap and at a horizontal plane.

5. The socket assembly as described in claim 4, wherein the third step is formed by parts of the first posts and the second posts located below the step face, and outside surfaces of the third step and the second step are located in a same upright face.

6. The socket assembly as described in claim 5, wherein a plurality of leading faces extend upwardly from inner sides of a bottom face of the third step of the pick-up cap, and a locking portion with a clasp is formed between two second posts in a same side.

7. The socket assembly as described in claim 6, wherein the insulative housing defines two recesses to engage with the clasps of the pick-up cap, and a plurality of protrusions are formed on outer edges of the bottom surface of the insulative housing.

8. The socket assembly as described in claim 7, wherein the third step of the pick-up cap and the protrusions of the insulative housing together abut against the printed circuit board.

9. The socket assembly as described in claim 8, wherein a protruding portion is formed on each of four corners of the insulative housing and extends outwardly, the protruding portion defines a slot near the sidewall and a locking portion extending upwardly from a bottom wall of the slot, and the locking portion including a locking arm and a hook disposed on an end of the locking arm and protruding toward a center of the insulative housing.

10. A socket assembly adapted for electrically connecting an IC package to a printed circuit board comprising:
    an insulative housing having a plurality of the passageways, a sidewalls surrounding the passageways and a plurality of protrusions extending downwardly from a bottom face thereof;
    a pick-up cap attached upon the insulative housing, the pick-up cap comprising a first step, a second step and a third step, a step face of the second step seated on top faces of the sidewalls of the insulative housing, and a bottom face of the third step abutting against the printed circuit board together with the protrusions of the insulative housing.

11. The socket assembly as described in claim 10, wherein the first step is in a rectangular configuration and located in a center of the bottom face of the pick-up cap, the first step and has a distance with a plurality of contacts disposed in the passageways.

12. The socket assembly as described in claim 11, wherein the second step is located on a peripheral of a bottom face of the pick-up cap, and the third step is formed by parts of the first posts and second posts below the step face, outside surfaces of the third step and the second step are located in a same upright face.

13. The socket assembly as described in claim 12, wherein the pick-up cap has two first posts extending downwardly from two opposite edges of the first step and four second posts extending downwardly from the other two opposite edges of the first step, each of the first posts and second posts has a platform in a middle part thereof, and the platforms being coplanar and defining the step face of the second step cooperatively.

14. A socket connector, comprising:
   an insulative housing having a planar body with a mating interface and a mounting interface, a plurality of passageways extending from the mating interface toward the mounting interface;
   a plurality of contact terminals disposed within the passageways; and
   a pick up cap removeably attached to the insulative housing and having at least a pair of tabs extending beyond the mounting interface of the insulative housing.

15. The socket connector as recited in claim 14, wherein each of the contact terminals includes a solder tail with a solder mass attached thereto.

16. The socket connector as recited in claim 15, wherein a lower end of the tab is located in a position between the mounting interface and a lowest end of the solder mass.

17. The socket connector as recited in claim 14, further comprising four protruding portion extending upper from corners of the insulative housing, each of the protruding portion includes a latch.

18. The socket connector as recited in claim 14, wherein the pickup cap includes a pair of hooks removeably attaching the pick-up cap to the insulative housing.

\* \* \* \* \*